United States Patent
Lai

(10) Patent No.: US 12,009,834 B2
(45) Date of Patent: Jun. 11, 2024

(54) CONTROL CIRCUIT AND METHOD FOR CALIBRATING SIGNAL CONVERTER, AND SIGNAL CONVERSION SYSTEM USING THE SAME

(71) Applicant: NUVOTON TECHNOLOGY CORPORATION, Hsinchu (TW)

(72) Inventor: Yun Kai Lai, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 38 days.

(21) Appl. No.: 17/687,858

(22) Filed: Mar. 7, 2022

(65) Prior Publication Data

US 2023/0036211 A1 Feb. 2, 2023

(30) Foreign Application Priority Data

Jul. 29, 2021 (TW) ................. 110127912

(51) Int. Cl.
*H03M 1/10* (2006.01)
*H03M 1/06* (2006.01)
*H03M 1/08* (2006.01)
*H03M 1/36* (2006.01)
*H03M 1/76* (2006.01)

(52) U.S. Cl.
CPC ........... *H03M 1/76* (2013.01); *H03M 1/0626* (2013.01); *H03M 1/08* (2013.01); *H03M 1/368* (2013.01)

(58) Field of Classification Search
CPC .... H03M 1/66; H03M 1/1061; H03M 1/1009; H03M 1/1023; H03M 1/742; H03M 1/12; H03M 1/46; H03M 1/1033; H03M 1/745; H03M 1/1057; H03M 1/462; H03M 1/00; H03M 1/002; H03M 1/1038; H03M 1/468; H03M 1/662; H03M 1/0607; H03M 1/10
USPC ......................................... 341/118–121, 144
See application file for complete search history.

(56) References Cited

U.S. PATENT DOCUMENTS

| | | | | |
|---|---|---|---|---|
| 6,310,632 B1* | 10/2001 | Monroe | ................... | G06F 9/451 715/765 |
| 6,385,149 B1* | 5/2002 | Sekii | ...................... | G11B 19/02 369/53.37 |
| 6,667,703 B1* | 12/2003 | Reuveni | .............. | H03M 1/1028 341/120 |
| 7,978,109 B1* | 7/2011 | Kuramochi | ......... | H03M 1/0624 341/120 |
| 8,125,360 B1* | 2/2012 | Kutz | ................... | H03M 1/1061 341/120 |
| 8,138,822 B1* | 3/2012 | Cyrusian | ................. | G05F 1/561 327/157 |
| 9,356,615 B1* | 5/2016 | Ranjbar | .............. | H03M 1/1023 |
| 9,509,327 B2* | 11/2016 | Kibune | ............... | H03M 1/1009 |

(Continued)

*Primary Examiner* — Linh V Nguyen
(74) *Attorney, Agent, or Firm* — Muncy, Geissler, Olds & Lowe, P.C.

(57) ABSTRACT

A control circuit and a method of calibrating a signal converter (such as DAC) are disclosed. The control circuit can be an existing control circuit, so no additional calibration circuit is required and the circuit area can be reduced. The control circuit can be an embedded microcontroller or other type of microcontroller. In general, the microcontroller includes an analog comparator and an arithmetic unit. With the combination of using the arithmetic unit to execute firmware program codes and using of the analog comparator, the control circuit is able to calibrate the signal converter.

18 Claims, 4 Drawing Sheets

(56) References Cited

U.S. PATENT DOCUMENTS

| | | | |
|---|---|---|---|
| 2009/0195422 A1* | 8/2009 | Bailey | H03M 1/361 341/110 |
| 2017/0302288 A1* | 10/2017 | Huang | H03M 1/1061 |
| 2018/0358883 A1* | 12/2018 | Saputra | H03M 1/00 |
| 2019/0211861 A1* | 7/2019 | Ku | F16B 13/065 |
| 2023/0036535 A1* | 2/2023 | Darzy | H03M 1/66 |

* cited by examiner

CONTROL CIRCUIT AND METHOD FOR CALIBRATING SIGNAL CONVERTER, AND SIGNAL CONVERSION SYSTEM USING THE SAME

BACKGROUND

1. Technical Field

The present disclosure relates to an automatic calibration technology for a signal converter, such as digital to analog converter (DAC), and more particularly to a control circuit for a signal converter, and a method thereof, and a signal conversion system using the control circuit, the control circuit can be an existing control circuit, so the present disclosure does not need additional calibration circuit and can reduce circuit area.

2. Description of the Related Art

The internal components of a DAC may have different aging speeds because of factors such as environmental temperature and component use time, and it will result in undesired an offset in digital-to-analog conversion. In the conventional technology, the way to calibrate the DAC is to add a calibration circuit, and the calibration circuit uses an analog comparator to compare reference signal with the analog signal, which is actually converted by the DAC, and calibrate the DAC based on a comparison result. It is necessary to add the additional calibration circuit with the analog comparator, so the circuit area of the entire chip increases inevitably. In addition, the additional calibration circuit also increases power consumption.

Furthermore, the existing calibration circuit is unable to automatically calibrate the DAC in response to hacker attacks, for example, one of the common chip attack methods is to increase or decrease the temperature to make the DAC in the chip output incorrect analog signal, so as to achieve the purpose of the attack. Therefore, there is a need to provide a DAC calibration technical solution that does not greatly increase circuit area and power consumption, and also can resist hacker attacks.

SUMMARY

According to the objective of the present disclosure, the embodiment of the present disclosure proposes a control circuit applied to a signal converter, and the control circuit includes a switch, an analog comparator and a signal converter control unit. An input terminal of the switch is electrically connected to an output terminal of the signal converter and configured to receive an analog signal, which is outputted by the signal converter by converting a digital signal, an output terminal of the switch is selectively conducted to the input terminal based on an event trigger signal, and an initial value of the digital signal corresponds to an analog reference signal. A first input terminal of the analog comparator receives the analog reference signal, and a second input terminal of the analog comparator is electrically connected to an output terminal of the switch. The signal converter control unit is electrically connected to an output terminal of the analog comparator and an input terminal of the signal converter, and the signal converter control unit is selectively enabled to transmit the digital signal to the input terminal of the signal converter based on the event trigger signal. When the signal converter control unit determines that a comparison signal outputted from the analog comparator has no transition, the signal converter control unit increases or decreases a value of the digital signal based on an comparison signal, when the signal converter control unit determines that the comparison signal outputted from the analog comparator has transition, the signal converter control unit records the value of the digital signal after transition or before transition, so as to obtain an offset of the signal converter.

According to the objective of the present disclosure, the embodiment of the present disclosure further proposes a signal conversion system, and a method applied to a signal converter. The signal conversion system uses the above-mentioned control circuit, the method applied to the signal converter can be executed by the above-mentioned control circuit.

According to the above-mentioned contents, the embodiment of the present disclosure provides a control circuit, a method and a signal conversion system that are applied to the signal converter, which does not require additional calibration circuit, so the circuit area and power consumption can be reduced compared with the conventional technology.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
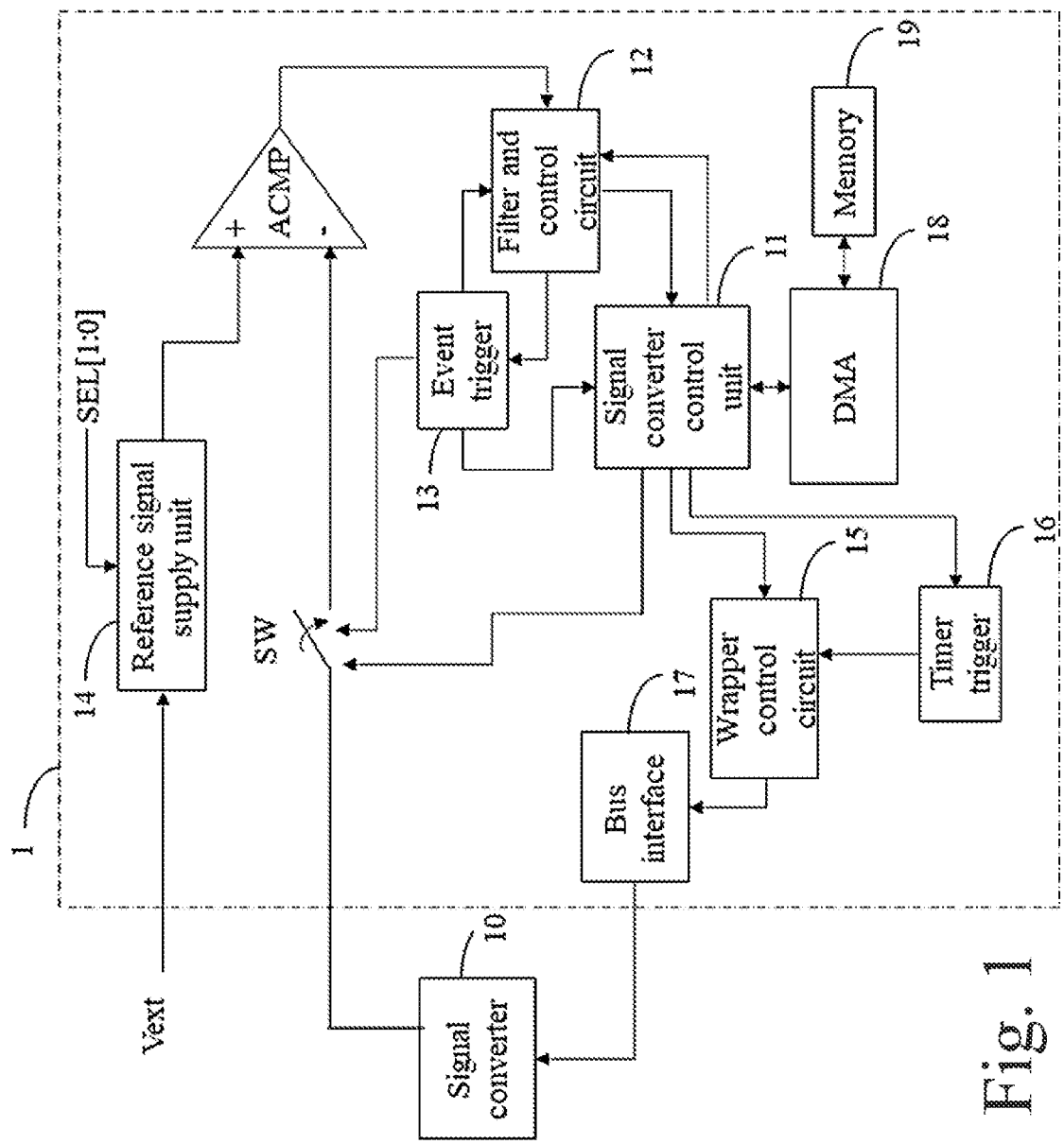
FIG. 1 is a block diagram of a control circuit applied to a signal converter, according to an embodiment of the present disclosure.

The following embodiments of the present disclosure are herein described in detail with reference to the accompanying drawings. These drawings show specific examples of the embodiments of the present disclosure. These embodiments are provided so that this disclosure will be thorough and complete, and will fully convey the scope of the disclosure to those skilled in the art. It is to be acknowledged that these embodiments are exemplary implementations and are not to be construed as limiting the scope of the present disclosure in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The embodiments of the present disclosure provide a control circuit and a method, and a signal conversion system applied to a signal converter (such as DAC). For example, the control circuit can be an existing control circuit, so the present disclosure does not need additional calibration circuit and the circuit area can be reduced compared with the conventional technology. The control circuit can be, for example, an embedded microcontroller or other type of microcontroller. In general, the microcontroller includes an analog comparator and an arithmetic unit, and the configuration of using the arithmetic unit to execute a firmware program code and using the analog comparator is able to implement the objective of using the control circuit to calibrate the signal converter in the present disclosure. Furthermore, in other implementations, the control circuit can be implemented by hardware circuit and has a function other than calibrating the signal converter. The present disclosure does not need an additional calibration circuit, so that the circuit area can be reduced; furthermore, using the control circuit to calibrate the signal converter does not occupy the resource of the processor, and the signal converter can be calibrated only when a specific event occurs, so that the technical solution of the present disclosure can decrease power consumption compared with the conventional technology. Furthermore, the specific event can be the event of detecting the hacking attack on the chip, so as to implement the effect of preventing hacking attack on the chip.

Furthermore, the present disclosure can be applied to the signal converter not having the calibration circuit, such signal converter can be electrically connected to the existing control circuit, so as to complete calibration for the signal converter according to the present disclosure. In a scenario where the existing external signal converter calibration circuit is disable or inaccurate, the control circuit can be used to calibrate the signal converter according to the present disclosure. To perform the calibration for the signal converter, an automatic calibration mode can be activated every certain period, so that the aging problem of the signal converter can be solved and the signal converter can be normally used for long periods of time. In one of embodiments of the present disclosure, the signal converter can be an internal signal converter of the control circuit, so that it does not need to exchange signals between the analog circuit and the digital circuit to calibrate the offset of the signal converter being the analog circuit. When the signal converter is a DAC, the signal converter can be an internal DAC inside the control circuit or an external DAC outside the control circuit, the configuration position and type of the signal converter of the present disclosure is not limited to the above-mentioned example.

It should be noted that the signal converter of the present disclosure can refer to the circuit receiving a digital signal as input and outputting an analog signal as output, and the relationship between the input and the output can be linear or nonlinear. For example, the converter can be the DAC linearly converting the value of the digital signal into the analog signal, or the converter can be a modulation circuit generating different analog RF modulation signals based on the digital signal.

Please refer to FIG. 1, which is a block diagram of a control circuit applied to a signal converter, according to an embodiment of the present disclosure. The control circuit 1 for calibrating a signal converter 10 can includes an analog comparator ACMP, a switch SW, signal converter control unit 11, a filter and control circuit 12, an event trigger 13, a reference signal supply unit 14, a wrapper control circuit 15, a timer trigger 16, a bus interface 17, a direct memory access 18 and a memory 19.

A first input terminal of the analog comparator ACMP is electrically connected to an output terminal of the reference signal supply unit 14, an input terminal of the switch SW is electrically connected to an output terminal of the signal converter 10, an output terminal of the switch SW is electrically connected to an second input terminal of the analog comparator ACMP, a first input terminal and a second input terminal of the analog comparator ACMP can be a non-inverting input terminal and an inverting input terminal, respectively, or the first input terminal and the second input terminal of the analog comparator ACMP can be the inverting input and the non-inverting input terminal, respectively. In this embodiment, the first input terminal and the second input terminal of the analog comparator ACMP are the non-inverting input terminal and the inverting input terminal, respectively.

The signal converter control unit 11 is electrically connected to the filter and control circuit 12, the event trigger 13, the wrapper control circuit 15, the timer trigger 16, the direct memory access 18, and a control terminal of the switch SW. The event trigger 13 is electrically connected to the control terminal of the switch SW and the filter and control circuit 12, an output terminal of the analog comparator ACMP is electrically connected to the filter and control circuit 12, the wrapper control circuit 15 is electrically connected to the bus interface 17 and the timer trigger 16, and the bus interface 17 is electrically connected to an input terminal of the signal converter 10. Through the above-mentioned electric connection relationship, the signal converter control unit 11 can be electrically connected to an input terminal of the signal converter 10 through the wrapper control circuit 15 and the bus interface 17. Furthermore, the direct memory access 18 is electrically connected to the memory 19.

The control terminal of the switch SW receives an event trigger signal generated by the event trigger 13, or a control signal of the signal converter control unit 11, so that the conduction between the input terminal of the switch SW and the output terminal is controlled by the signal converter control unit 11. Generally, the switch SW can be kept turning on when the event trigger signal is generated; however, in order to reduce power consumption, the switch SW is additionally controlled by the signal converter control unit 11, and the switch SW is turned on only when the signal converter 10 obtains the updated digital signal. The input terminal of the switch SW receives the analog signal, which is outputted by the signal converter 10 by converting the digital signal, and when the input terminal and the output terminal of the switch SW are conducted, the analog signal is transmitted to the second input terminal of the analog comparator ACMP. The initial value of the digital signal corresponds to the analog reference signal provided by the reference signal supply unit 14. The first input terminal of the analog comparator ACMP receives the analog reference signal, the comparison signal generated based on the comparison of the analog reference signal and the analog signal is outputted from the output terminal of the analog comparator ACMP.

Figure 3:
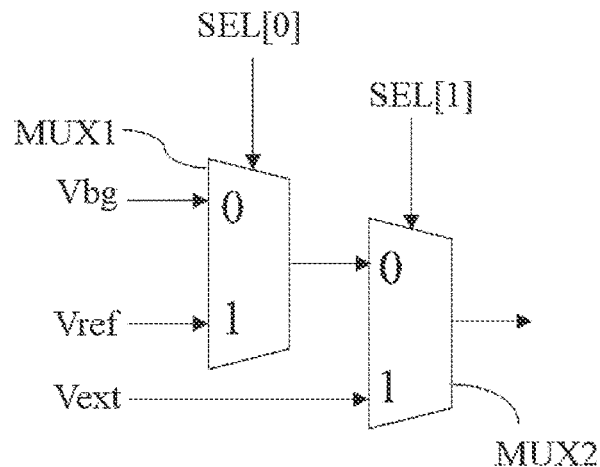
FIG. 3 is a block diagram of a reference signal supply unit in a control circuit applied to a signal converter, according to an embodiment of the present disclosure.

In embodiments of the present disclosure, the reference signal supply unit 14 is configured to provide the analog reference signal, the analog reference signal can be selected from the group including an internal reference voltage Vref (shown in FIG. 3), an external reference voltage Vext, and a bandgap voltage Vbg (shown in FIG. 3). The internal reference voltage Vref is the internal reference voltage generated by the control circuit 1, the external reference voltage Vext is a reference voltage from outsides of the control circuit 1, and the bandgap voltage Vbg is generated by a bandgap voltage generator. Furthermore, the reference signal supply unit 14 performs selection based on a selection signal SEL[1:0]. The reference signal supply unit 14 is electrically connected to the signal converter control unit 11, and the selection signal SEL[1: 0] can be generated by the signal converter control unit 11. It should be noted that the reference signal supply unit 14 is not a necessary component, and the analog reference signal can be one of the internal reference voltage Vref (as shown in FIG. 3), the external reference voltage Vext, and the bandgap voltage Vbg (as shown in FIG. 3).

The event trigger 13 is configured to detect whether a specific event occurs, to generate the event trigger signal, so as to trigger the control circuit 1 to perform the automatic calibration mode for calibrating the signal converter 10. The specific event includes at least one of a period event which is generated by periodically timing to a specific time, a forced-calibration event, and a temperature increasing/decreasing event. The specific time can be set by the signal converter control unit 11, for example, the signal converter 10 can be automatically calibrated every ten days. The temperature increasing/decreasing event can be determined based on the change in a temperature obtained by a temperature sensor, and the hackers usually attack a chip by changing the temperature of the chip to make the change in the offset of the signal converter 10, so as to make the signal converter 10 output incorrect analog signal, thereby achieving the attack purpose. The forced-calibration event means the detection of an event for the forced calibration generated by a user, a developer or maintenance staff by using debug tools. The above-mentioned types of the specific event are examples for illustration, but the concept of the present disclosure is not limited thereto.

The signal converter control unit 11 can be enabled by an event trigger signal and transmit the digital signal to the input terminal of the signal converter 10 after being enabled. Generally, initial value of the digital signal can be stored in the memory. As a result, when the signal converter 10 is enabled by the timer trigger signal generated by the timer trigger 16, the signal converter 10 performs signal conversion on the digital signal to generate the analog signal. The timer trigger 16 is controlled by the signal converter control unit 11, to generate the timer trigger signal for enabling the signal converter 10, and the reciprocal of the periodic trigger time of the timer trigger signal is a frequency of updating the analog signal by the signal converter 10. The periodic trigger time can be set by the signal converter control unit 11. Furthermore, the signal converter control unit 11 can be further activated correspondingly to the timer trigger signal only after the signal converter control unit 11 is enabled by the event trigger signal, so as to reduce power consumption.

After the timer trigger signal enables the signal converter 10, when the signal converter control unit 11 determines that a comparison signal outputted from the analog comparator ACMP has no transition, the signal converter control unit 11 can increase or decrease the value of the digital signal based on the comparison signal; in contrast, when the signal converter control unit 11 determines that the comparison signal outputted from the analog comparator ACMP has transition, the signal converter control unit 11 records the value of the digital signal after or before the transition, so as to obtain an offset of the signal converter 10.

In more detail, when the digital signal is an initial value, the comparison signal has no transition, so the value of the digital signal can be increased or decreased to update based on the logic level of the comparison signal being logic high level or logic low level. Next, when the signal converter 10 is enabled by the next timer trigger signal, the signal converter 10 generates the analog signal based on the updated digital signal, the analog comparator ACMP performs comparison, and when the generated comparison signal has a transition, the value of the digital signal before or after the transition is recorded; in contrast, when the generated comparison signal has no transition, the value of the digital signal is continuously increased or decreased to update the digital signal, and when the signal converter 10 is enabled by the next timer trigger signal, the analog comparator ACMP performs comparison again.

In a condition that the analog reference signal is 0 mV and the corresponding initial value of the digital signal is 0, and when the accumulated value of the digital signal is 10, the transition of the comparison signal occurs, so the value 9 or 10 of the digital signal is recorded, and, the offset of the signal converter 10 can be calculated as 9 mV or 10 mV when the unit of the value of the digital signal represents 1 mV. In a condition that the analog reference signal is 300 mV and the corresponding initial value of the digital signal is 150, and the transition of the comparison signal occurs when the accumulated value of the digital signal is 145, the value 146 or 145 of the digital signal is recorded, so the offset of the signal converter 10 can be calculated as −8 mV or −10 mV when the unit of the value of the digital signal represents 2 mV.

In general, the comparison signal of the analog comparator ACMP may be influenced by noise, and the signal converter control unit 11 may make a wrong determination based on the influenced comparison signal. Therefore, in this embodiment, the filter and control circuit 12 is enabled based on the event trigger signal, and performs noise filtering on the comparison signal, which is output from the analog comparator ACMP, to output the noise-filtered comparison signal to the signal converter control unit 11. However, in the environment with less noise influence, the filter and control circuit 12 can be ignored to decrease hardware cost. Furthermore, the filter and control circuit 12 can be activated by the timer trigger signal after being enabled by the event trigger signal, so as to reduce power consumption. Furthermore, in the embodiment, the signal converter control unit 11 sets the event trigger 13 through the filter and control circuit 12, but the concept of the present disclosure is not limited thereto.

The direct memory access 18 is configured to serve as a data transmission bridge for the signal converter control unit 11 to access the memory 19, and the signal converter control unit 11 does not need to access the memory 19 through the processing unit, so as to prevent from occupying the resource of the processing unit. Furthermore, the memory 19 can be a static random access memory, flash memory, or other type of memory; furthermore, the memory 19 is not necessary to locate inside the control circuit 1, for example, the memory 19 can be the memory outside the control circuit 1, and the direct memory access 18 can be the peripheral direct memory access, and but the concept of the present disclosure is not limited thereto. It should be noted that the direct memory access 18 and the memory 19 are not necessary components; although temporarily storing the value of the calibrated digital signal in the memory 19 and directly using the value in next calibration can reduce calibration time, the direct memory access 18 and the memory 19 can be ignored in a condition that the calibration time is not considered and decreasing of circuit cost is considered.

In an embodiment of FIG. 1, the signal converter 10 can be an external DAC other than the control circuit 1, and the control circuit 1 is a single chip. Unless the control circuit 1 and the external DAC have special design of, such as, using the clock and data format with the same specification, a communication interface is required between the control circuit 1 and the external DAC, that is, the wrapper control circuit 15 and the bus interface 17 are required in a normal condition. The wrapper control circuit can be enabled based on a timer trigger signal, and configured to buffer and output the digital signal, and output the timer trigger signal. The bus interface 17 transmits the digital signal and the timer trigger signal to the signal converter 10 outsides the control circuit 1. The bus interface 17 can be implemented by, for example, an I2C interface, but the present disclosure is not limited thereto.

According to the above-mentioned contents, the control circuit 1 can be any type of the arithmetic circuit including the analog comparator ACMP, for example, the control circuit 1 can be the embedded microcontroller. The arithmetic circuit executes a firmware program code to configure the switch SW, the signal converter control unit 11, the event trigger 13, the wrapper control circuit 15 and the timer trigger 16; or all the components of the control circuit 1 are implemented by multiple hardware circuits, and not implemented by executing firmware program code.

Figure 2:
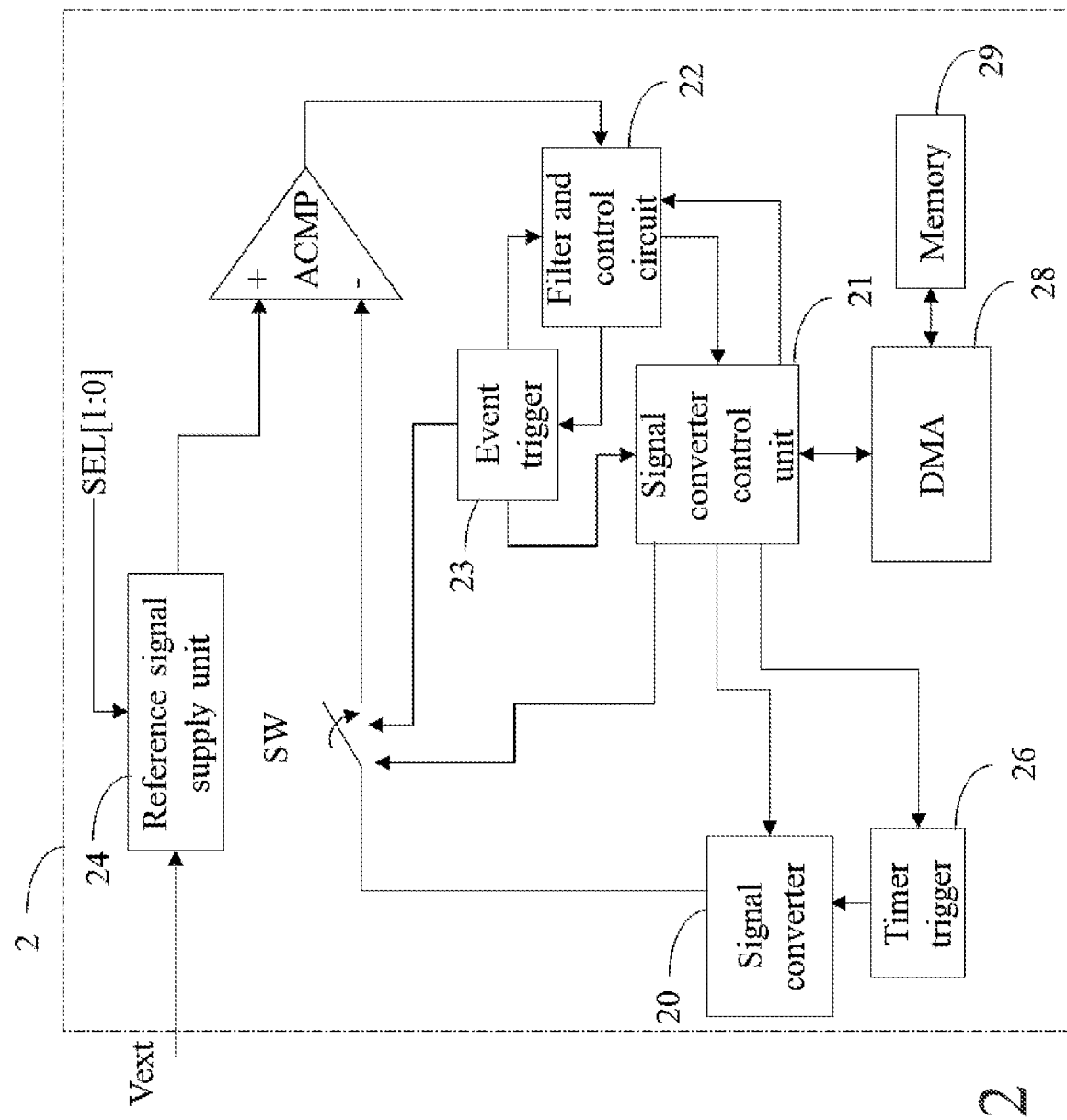
FIG. 2 is a block diagram of a control circuit applied to a signal converter, according to another embodiment of the present disclosure.

Please refer to FIG. 2, which is a block diagram of a control circuit applied to a signal converter, according to another embodiment of the present disclosure. The difference between the control circuit 2 and the control circuit 1 of FIG. 1 is that the control circuit 2 is single chip including the signal converter 20, that is, the signal converter 20 is the internal DAC inside the control circuit 2. In the embodiment, the reference signal supply unit 24, the analog comparator ACMP, the filter and control circuit 22, the signal converter control unit 21, the event trigger 23, the timer trigger 26, the direct memory access 28 and the memory 29 are the same as the reference signal supply unit 14, the analog comparator ACMP, the filter and control circuit 12, the signal converter control unit 11, the event trigger 13, the timer trigger 16, the direct memory access 18 and the memory 19 of FIG. 1, so the detailed descriptions are not repeated herein. The signal converter 20 is the internal DAC of the control circuit 2, so it does not need the wrapper control circuit 15 and the bus interface 17, and the timer trigger 26 and the signal converter control unit 21 can be directly electrically connected to the signal converter 20.

Please refer to FIG. 3, which is a block diagram of a reference signal supply unit in a control circuit applied to a signal converter, according to an embodiment of the present disclosure. The reference signal supply unit can include two multiplexers MUX1 and MUX2.

The two input terminals of the multiplexer MUX1 receive the bandgap voltage Vbg and the internal reference voltage Vref, respectively, and the multiplexer MUX1 determines to output one of the bandgap voltage Vbg and the internal reference voltage Vref through the output terminal of the multiplexer MUX1 based on the first bit SEL[0] of the selection signal SEL[1: 0]. The two input terminals of the multiplexer MUX2 receive the output of the multiplexer MUX1 and the external reference voltage Vext, respectively, and the multiplexer MUX2 determines to output one of the external reference voltage Vext and the output of the multiplexer MUX1 through the output terminal of the multiplexer MUX2 based on the second bit SEL[1] of the selection signal SEL[1:0].

Figure 4A:
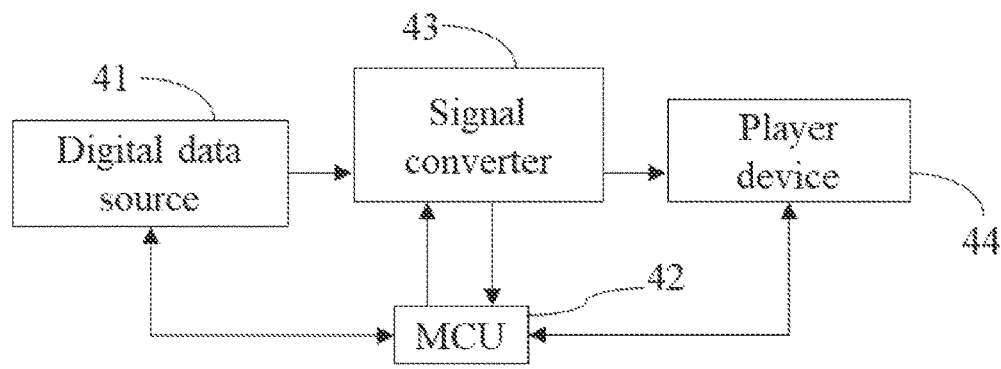
FIG. 4A is a block diagram of a signal conversion system according to an embodiment of the present disclosure.
Figure 4B:
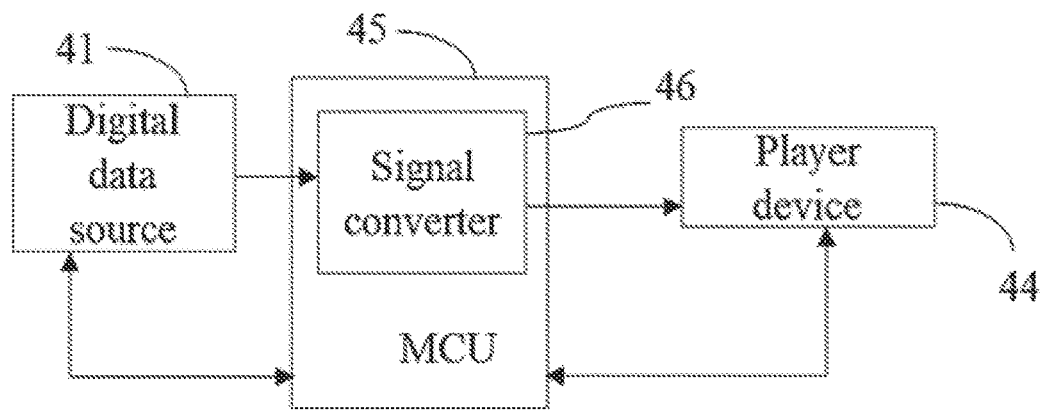
FIG. 4B is a block diagram of a signal conversion system according to another embodiment of the present disclosure.

Please refer to FIGS. 4A and 4B. FIG. 4A is a block diagram of a signal conversion system according to an embodiment of the present disclosure, and FIG. 4B is a block diagram of a signal conversion system according to another embodiment of the present disclosure. In the two embodiments, the signal conversion system includes a digital data source 41, a control circuit, an analog signal processing device, and one of a signal converter 43 and 46. The digital data source 41 is electrically connected to one of the signal converters 43 and 46, and the control circuit, and the analog signal processing device is electrically connected to one of the signal converters 43 and 46, and the control circuit. In each of the two embodiments, the control circuit is one of microcontroller 42 and 45, the signal converter 43 is an external DAC outside the microcontroller 42, the signal converter 46 is an internal DAC inside the microcontroller 45, the analog signal processing device is the player device 44, such as an image or audio player device. Furthermore, in other implementations, the analog signal processing device can be a signal quality enhancement device, such as vacuum tube audio enhancement device, the configuration position and type of the signal converter of the present disclosure is not limited to the above-mentioned example, that is, the present disclosure is not limited to the analog signal processing device.

Figure 5:
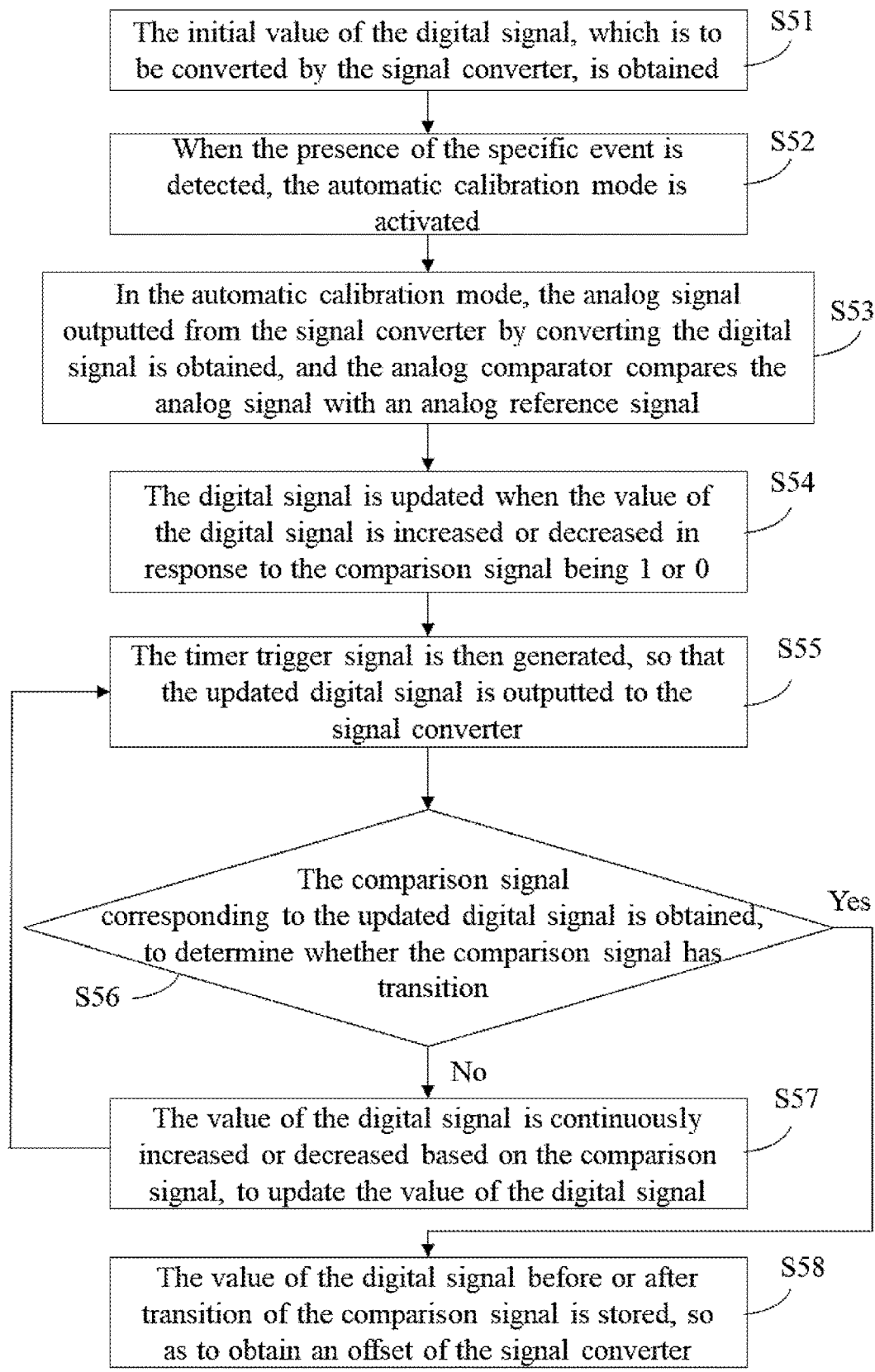
FIG. 5 is a flowchart of a method applied to a signal converter, according to an embodiment of the present disclosure.

Please refer to FIG. 5, which is a flowchart of a method applied to a signal converter, according to an embodiment of the present disclosure. The method for calibrating the signal converter is executed in the arithmetic circuit including the analog comparator. The method includes steps S51 to S58. In the step S51, the initial value of the digital signal, which is to be converted by the signal converter, is obtained; for example, the previously-calibrated value obtained from the memory is used as the initial value, or the initial value is directly generated. Furthermore, the periodic trigger time of the timer trigger signal, and the specific event can be also set in this step. In the step S52, when the presence of the specific event is detected, the automatic calibration mode is activated.

In the step S53, in the automatic calibration mode, the analog signal outputted from the signal converter by converting the digital signal is obtained, and the analog comparator compares the analog signal with an analog reference signal. The initial value of the digital signal corresponds to an analog reference signal. In the step S54, the digital signal is updated when the value of the digital signal is increased or decreased. In the step S55, the timer trigger signal is then generated, so that the updated digital signal is outputted to the signal converter, and the signal converter generates the analog signal based on the updated digital signal. In the step S56, the comparison signal corresponding to the updated digital signal is obtained, to determine whether the comparison signal has transition; when the comparison signal has no transition, the step S57 is executed, the value of the digital signal is continuously increased or decreased based on the comparison signal, to update the value of the digital signal, and the step S55 is continuously executed after the step S57. When the comparison signal has a transition, the value of the digital signal before or after transition of the comparison signal is stored, so as to obtain an offset of the signal converter.

According to the above-mentioned contents, the embodiment of the present disclosure provides a control circuit, a method and a signal conversion system that are applied to signal converter; compared with the conventional technology, the present disclosure does not need additional calibration circuit, and can reduce circuit area and power consumption, so as to prevent from occupying the resource of the processor, hacking attack on the chip and aging of the signal converter.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A control circuit for calibrating a signal converter, comprising,
    a switch, wherein an input terminal of the switch is electrically connected to an output terminal of the signal converter and configured to receive an analog signal, which is outputted by the signal converter by converting a digital signal, an output terminal of the switch is selectively conducted to the input terminal based on an event trigger signal, and an initial value of the digital signal corresponds to an analog reference signal;
    an analog comparator, wherein a first input terminal of the analog comparator receives the analog reference signal, and a second input terminal of the analog comparator is electrically connected to an output terminal of the switch;
    a signal converter control unit electrically connected to an output terminal of the analog comparator and an input terminal of the signal converter, wherein the signal converter control unit is selectively enabled to transmit the digital signal to the input terminal of the signal converter based on the event trigger signal;
    wherein when the signal converter control unit determines that a comparison signal outputted from the analog comparator has no transition, the signal converter control unit increases or decreases a value of the digital signal based on an comparison signal, when the signal converter control unit determines that the comparison signal outputted from the analog comparator has transition, the signal converter control unit records the value of the digital signal after transition or before transition, so as to obtain an offset of the signal converter; and,
    a filter and control circuit electrically connected between the output terminal of the signal converter and the signal converter control unit, wherein based on an event trigger signal, the filter and control circuit is enabled based on an event trigger signal, to perform noise filtering on the comparison signal outputted from the analog comparator, and output the noise-filtered comparison signal to the signal converter control unit.

2. The control circuit according to claim 1, further comprising:
    a direct memory access electrically connected to the signal converter control unit; and
    a memory electrically connected to the direct memory access, wherein the memory stores the value of the digital signal;
    wherein the direct memory access is served as a data transmission bridge for the signal converter control unit to access the memory.

3. The control circuit according to claim 1, further comprising:
    an event trigger electrically connected to the switch and the signal converter control unit, wherein the event trigger detects whether a specific event occurs, to generate the event trigger signal; and
    a timer trigger electrically connected to the signal converter control unit, wherein the timer trigger is controlled by the signal converter control unit to enable the signal converter based on a timer trigger signal.

4. The control circuit according to claim 3, wherein the signal converter is an external digital to analog converter outside the control circuit, the control circuit is a single chip, and the control circuit comprises:
    a wrapper control circuit electrically connected to the signal converter control unit and the timer trigger, wherein the wrapper control circuit is enabled based on the timer trigger signal and configured to buffer and output the digital signal, and output the timer trigger signal; and
    a bus interface electrically connected to the wrapper control circuit and the external DAC, wherein the bus interface transmits the digital signal and the timer trigger signal to the external DAC.

5. The control circuit according to claim 3, wherein the control circuit is a single chip, and the control circuit comprises an internal DAC, the signal converter is the internal DAC, and the internal DAC is electrically connected to the timer trigger.

6. The control circuit according to claim 3, wherein the signal converter control unit is configured to set the specific event and a periodic trigger time of the timer trigger signal, and the signal converter control unit controls conduction between the input terminal of the switch and the output terminal.

7. The control circuit according to claim 1, further comprising:
    a reference signal supply unit electrically connected to the first input terminal of the analog comparator, wherein the reference signal supply unit provides the analog reference signal, and the analog reference signal is one of an internal reference voltage, an external reference voltage, and a bandgap voltage.

8. The control circuit according to claim 3, wherein the control circuit is an arithmetic circuit comprising the analog comparator, the arithmetic circuit executes a firmware program code to configure the switch, the signal converter control unit, the event trigger, and the timer trigger; or the switch, the signal converter control unit, the event trigger and the timer trigger are implemented by a plurality of hardware circuits.

9. A signal conversion system, comprising:
a signal converter;
a control circuit calibrating the signal converter, and comprising:
a switch, wherein an input terminal of the switch is electrically connected to an output terminal of the signal converter, the switch receives an analog signal, which is outputted by the signal converter by converting a digital signal, an output terminal and the input terminal of the switch are conducted to each other based on an event trigger signal, and an initial value of the digital signal corresponds to an analog reference signal;
an analog comparator, wherein a first input terminal of the analog comparator receives the analog reference signal, and a second input terminal of the analog comparator is electrically connected to an output terminal of the switch; and
a signal converter control unit electrically connected to an output terminal of the analog comparator and an input terminal of the signal converter, wherein the signal converter control unit is enabled to transmit the digital signal to the input terminal of the signal converter, based on an event trigger signal;
wherein when the signal converter control unit determines that a comparison signal outputted from the analog comparator has no transition, the signal converter control unit increases or decreases a value of the digital signal based on a comparison signal, and when the signal converter control unit determines that the comparison signal outputted from the analog comparator has transition, the signal converter control unit records the value of the digital signal after transition or before transition, so as to obtain an offset of the signal converter; and,
a filter and control circuit electrically connected between the output terminal of the signal converter and the signal converter control unit, wherein the filter and control circuit is enabled based on an event trigger signal to perform noise filtering on the comparison signal outputted from the analog comparator and output the noise-filtered comparison signal to the signal converter control unit.

10. The signal conversion system according to claim 9, wherein the control circuit comprises
a direct memory access electrically connected to the signal converter control unit; and
a memory electrically connected to the direct memory access, wherein the memory stores the value of the digital signal;
wherein the direct memory access is served as a data transmission bridge for the signal converter control unit to access the memory.

11. The signal conversion system according to claim 9, wherein the control circuit comprises:
an event trigger electrically connected to the switch and the signal converter control unit, wherein the event trigger detects whether a specific event occurs, so as to generate the event trigger signal; and
a timer trigger electrically connected to the signal converter control unit, wherein the timer trigger is controlled by the signal converter control unit, to enable the signal converter based on a timer trigger signal.

12. The signal conversion system according to claim 11, wherein the signal converter is an external digital to analog converter outside the control circuit, the control circuit is a single chip, and the control circuit comprises:
a wrapper control circuit electrically connected to the signal converter control unit and the timer trigger, wherein the wrapper control circuit is enabled based on a timer trigger signal to buffer and output the digital signal, and output the timer trigger signal; and
a bus interface electrically connected to the wrapper control circuit and the external DAC, wherein the bus interface transmits the digital signal and the timer trigger signal to the external DAC.

13. The signal conversion system according to claim 11, wherein the control circuit is a single chip, and the control circuit comprises an internal DAC, the signal converter is the internal DAC, and the internal DAC is electrically connected to the timer trigger.

14. The signal conversion system according to claim 11, wherein the signal converter control unit is configured to set the specific event and a periodic trigger time of the timer trigger signal, and the signal converter control unit is configured to control conduction between the input terminal of the switch and the output terminal.

15. The signal conversion system according to claim 11, wherein the control circuit is an arithmetic circuit comprising the analog comparator, the arithmetic circuit executes a firmware program code to configure the switch, the signal converter control unit, the event trigger and the timer trigger; or the switch, the signal converter control unit, the event trigger and the timer trigger are implemented by a plurality of hardware circuits.

16. The signal conversion system according to claim 9, further comprising:
digital data sources electrically connected to the signal converter and the control circuit; and
an analog signal processing device electrically connected to the signal converter and the control circuit;
wherein the analog signal processing device is a player device or a signal quality enhancement device previous to the player device.

17. A method for calibrating a signal converter, wherein the method is executed in an arithmetic circuit in an automatic calibration mode, the arithmetic circuit comprises an analog comparator, and the method comprises:
obtaining an initial value of the digital signal, wherein the signal converter converts the digital signal to generate the analog signal;
obtaining the analog signal, outputted from the signal converter by converting the digital signal, and using the analog comparator to compare the analog signal with an analog reference signal, wherein an initial value of the digital signal corresponds to an analog reference signal;
adjusting a value of the digital signal to update the digital signal, based on n comparison signal;
outputting the updated digital signal to the signal converter;
obtaining the comparison signal corresponding to the updated digital signal, to determine whether the comparison signal has a transition;
when the comparison signal has no transition, continuously increasing or decreasing the value of the digital signal based on the comparison signal; and when the comparison signal has a transition, storing the digital signal of the comparison signal before the transition or after the transition, to obtain an offset of the signal converter; wherein a filter and control circuit are electrically connected between the output terminal of the signal converter and the signal converter control unit, the filter and control circuit are activated by an event trigger signal to conduct noise filtering on the comparison signal outputted from the analog comparator, and the noise-filtered comparison signal is then transmitted to the signal converter control unit.

18. The method for calibrating signal converter according to claim 17, further comprising:

when an event trigger signal is enabled, obtaining the analog signal outputted by the signal converter, and outputting the updated digital signal to the signal converter, wherein when a specific event occurs, the event trigger signal is enabled, and the event trigger signal comprises at least one of a period event which is generated by periodically timing to a specific time, a forced-calibration event, and a temperature increasing/decreasing event.

\* \* \* \* \*